United States Patent
Ivanov et al.

(10) Patent No.: US 11,636,239 B2
(45) Date of Patent: Apr. 25, 2023

(54) METHOD AND APPARATUS FOR SIMULATING EVENTS ON SMART CITIES

(71) Applicant: AT&T Intellectual Property I, L.P., Atlanta, GA (US)

(72) Inventors: Aleksey Ivanov, Middletown, NJ (US); Barbara Laing, Colts Neck, NJ (US); Carey Joseph, Whitehouse Station, NJ (US); Donald Heatley, Warwick, NY (US); William O'Hern, Spring Lake, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 718 days.

(21) Appl. No.: 16/429,815

(22) Filed: Jun. 3, 2019

(65) Prior Publication Data
US 2020/0380086 A1 Dec. 3, 2020

(51) Int. Cl.
| | |
|---|---|
| *G06F 30/20* | (2020.01) |
| *G01V 99/00* | (2009.01) |
| *A63F 13/52* | (2014.01) |
| *A63F 13/216* | (2014.01) |

(52) U.S. Cl.
CPC ............ *G06F 30/20* (2020.01); *A63F 13/216* (2014.09); *A63F 13/52* (2014.09); *G01V 99/005* (2013.01); *A63F 2300/205* (2013.01)

(58) Field of Classification Search
CPC ........ G06F 30/20; G06F 30/13; A63F 13/216; A63F 13/52; A63F 13/65; A63F 13/822; A63F 2300/205; G01V 99/005
See application file for complete search history.

(56) References Cited

U.S. PATENT DOCUMENTS

| | | | |
|---|---|---|---|
| 11,036,903 B2* | 6/2021 | Basin | G06F 16/2228 |
| 2013/0332474 A1 | 12/2013 | Glaubman et al. | |
| 2016/0301710 A1 | 10/2016 | Hason | |
| 2017/0177755 A1 | 6/2017 | Beloglazov et al. | |

(Continued)

FOREIGN PATENT DOCUMENTS

| | | |
|---|---|---|
| CN | 107134011 A | 9/2017 |
| CN | 108304536 A | 7/2018 |

(Continued)

OTHER PUBLICATIONS

Montero et al. "A Visualization Tool Based on Traffic Simulation for the Analysis and Evaluation of Smart City Policies, Innovative Vehicles and Mobility Concepts". Proceedings of the 2017 Winter Simulation Conference. 12 Pages. (Year: 2017).*

(Continued)

*Primary Examiner* — Eunhee Kim
(74) *Attorney, Agent, or Firm* — Guntin & Gust, PLC; Douglas Schnabel

(57) ABSTRACT

A method and system, including a device having a processor and instructions stored on a non-transitory computer readable medium. In the system and method, data is identified and collected that is required to simulate a geographical area. The data is input into a simulation engine that runs a simulation of the geographical area. A scenario is identified to apply to the simulation, wherein the scenario is identified through employment on non-simulated data. The scenario is applied to the simulation by revising the data that is input to the simulation engine.

20 Claims, 3 Drawing Sheets

(56) References Cited

U.S. PATENT DOCUMENTS

| | | | | |
|---|---|---|---|---|
| 2017/0301220 | A1* | 10/2017 | Jarrell | G08B 25/08 |
| 2019/0079849 | A1 | 3/2019 | Korn et al. | |
| 2019/0266297 | A1* | 8/2019 | Krause | G05B 23/0245 |
| 2021/0392051 | A1* | 12/2021 | Rodriguez | H04L 67/12 |

FOREIGN PATENT DOCUMENTS

| | | |
|---|---|---|
| WO | WO 2011/061767 A1 | 5/2011 |
| WO | WO 2018/232990 A1 | 12/2018 |

OTHER PUBLICATIONS

Shahidehpour et al. "SmartCities for a Sustainable Urbanization". IEEE Jun. 2018. 18 Pages. (Year: 2018).*

Jamei et al. "Investigating the Role of Virtual Reality in Planning for Sustainable Smart Cities". Sustainability 2017, 9, 2006; doi: 10.3390/su9112006. 16 Pages. (Year: 2017).*

Fujimoto et al. "Dynamic Data Driven Application Systems for Smart Cities and Urban Infrastructures". Proceedings of the 2016 Winter Simulation Conference. 15 Pages. (Year: 2016).*

L. Lugaric, S. Krajcarand Z. Simic, "Smart city— Platform for emergent phenomena power system testbed simulator," 2010 IEEE PES Innovative Smart Grid Technologies Conference Europe (ISGT Europe), 2010, pp. 1-7, doi: 10.1109/ISGTEUROPE.2010.5638890. (Year: 2010).*

Lee et al. "Cyber attack scenarios on smart city and their ripple effects". 2019 International Conference on Platform Technology and Service (PlatCon). 2019. 7 Pages. (Year: 2019).*

Karnouskos et al. "Simulation of a Smart Grid City with Software Agents". 2009 Third UKSim European Symposium on Computer Modeling and Simulation. 6 Pages. (Year: 2009).*

Pettit, C. J., Barton, J., Goldie, X., Sinnott, R., Stimson, R., & Kvan, T. (2015). The Australian urban intelligence network supporting smart cities. In Planning support systems and smart cities (pp. 243-259). Springer, Cham. (Year: 2015).*

Olszewski, Robert, et al. "Spatiotemporal modeling of the smart city residents' activity with multi-agent systems." Applied Sciences 9.10 (May 2019): 2059. 25 Pages. (Year: 2019).*

Karnouskos et al.; "Simulation of a Smart Grid City with Software Agents"; IEEE Third UKSim European Symposium on Computer Modeling and Simulation; 2009; 6 pages.

Wang et al.; "Data Security and Threat Modeling for Smart City Infrastructure"; Int'l Conf. on Cyber Security of Smart cities, Industrial Control System and Communications (SSIC); 2015; 6 pages.

\* cited by examiner

METHOD AND APPARATUS FOR
SIMULATING EVENTS ON SMART CITIES

TECHNICAL FIELD

This disclosure generally relates to virtual simulations of real-world environments, and more particularly to simulations of the effects of various events on real world environments.

BACKGROUND

Real world environments, such as cities and towns and various other geographical areas that are organized and governed by governmental and pseudo-governmental organizations continue to be increasingly dependent on the systems that are used to manage their physical infrastructures. In the past, physical infrastructure (such as traffic lights, street lights, power generation, water, etc.) were managed primarily by human beings interacting with a physical infrastructure. As technological innovation occurred in computer systems, data processing, and robotics, it was possible to move management and implementation away from humans. Nevertheless, humans were still heavily involved in management of infrastructure through monitoring of systems and actuating various interfaces to manage infrastructure. Now, with continued technological advancements including machine learning, and artificial intelligence, the concept of the "smart city" has emerged and grown both in conceptual innovation and implementation.

A problem exists, however, in determining how to predict how unforeseen or unexpected events may affect smart cities. For example, an event such as a cyber-attack, a weather event, or a traffic event may cause a system wide reaction that could adversely affect different parts of a city, including those that are not the geographical focus of the original event. City planners and operators need to understand how certain events will affect certain parts of their cities so that they can plan and respond appropriately. Furthermore, the systems that manage cities need to be programmed, whether manually, through artificial intelligence, or machine learning to respond appropriately. Presently, there are no systems that can, in a sufficient manner, holistically simulate a city while providing for the introduction of unanticipated or unexpected events. Accordingly, what is needed are systems and methods for simulating events and providing remediation services

SUMMARY

In one embodiment, a method is provided. Data is identified and collected that is required to simulate a geographical area. The data is input into a simulation engine that runs a simulation of the geographical area. A scenario is identified to apply to the simulation, wherein the scenario is identified through employment on non-simulated data. The scenario is applied to the simulation by revising the data that is input to the simulation engine.

In one embodiment, the geographical area comprises a smart city. In one embodiment, the scenario comprises a cyber-attack perpetrated against the city. In one embodiment, the scenario comprises a catastrophical event. In one embodiment, the simulation engine comprises a game engine. In one embodiment, the non-simulated data comprises real-life data that is taken from the geographical area that is being simulated. In one embodiment, the non-simulated data includes performance data of a telecommunications network infrastructure of the geographical area. In one embodiment, the non-simulated data includes data taken from a power generation infrastructure of the geographical area. In one embodiment, the non-simulated data includes population data of the geographical area. In one embodiment, performance of at least one infrastructure component of the simulated city is monitored. A revised scenario based on changes to the performance of the at least one infrastructure component is identified. The revised scenario is applied to the simulation.

In one embodiment, a system is provided. The system has a device including a processor and instructions stored on a non-transitory computer readable medium, the instructions when executed perform a method: Data is identified and collected that is required to simulate a geographical area. The data is input into a simulation engine that runs a simulation of the geographical area. A scenario is identified to apply to the simulation, wherein the scenario is identified through employment on non-simulated data. The scenario is applied to the simulation by revising the data that is input to the simulation engine.

In one embodiment of the system, the geographical area comprises a smart city. In one embodiment, the scenario comprises a cyber-attack perpetrated against the city. In one embodiment, the scenario comprises a catastrophical event. In one embodiment, the simulation engine comprises a game engine. In one embodiment, the non-simulated data comprises real-life data that is taken from the geographical area that is being simulated. In one embodiment, the non-simulated data includes performance data of a telecommunications network infrastructure of the geographical area. In one embodiment, the non-simulated data includes data taken from a power generation infrastructure of the geographical area. In one embodiment, the non-simulated data includes population data of the geographical area. In one embodiment, performance of at least one infrastructure component of the simulated city is monitored. A revised scenario based on changes to the performance of the at least one infrastructure component is identified. The revised scenario is applied to the simulation.

BRIEF DESCRIPTION OF THE DRAWINGS

In the following description, for purposes of explanation, numerous specific details are set forth in order to provide an understanding of the variations in implementing the disclosed technology. However, the instant disclosure may take many different forms and should not be construed as limited to the examples set forth herein. Where practical, like numbers refer to like elements throughout.

DETAILED DESCRIPTION

Figure 1:
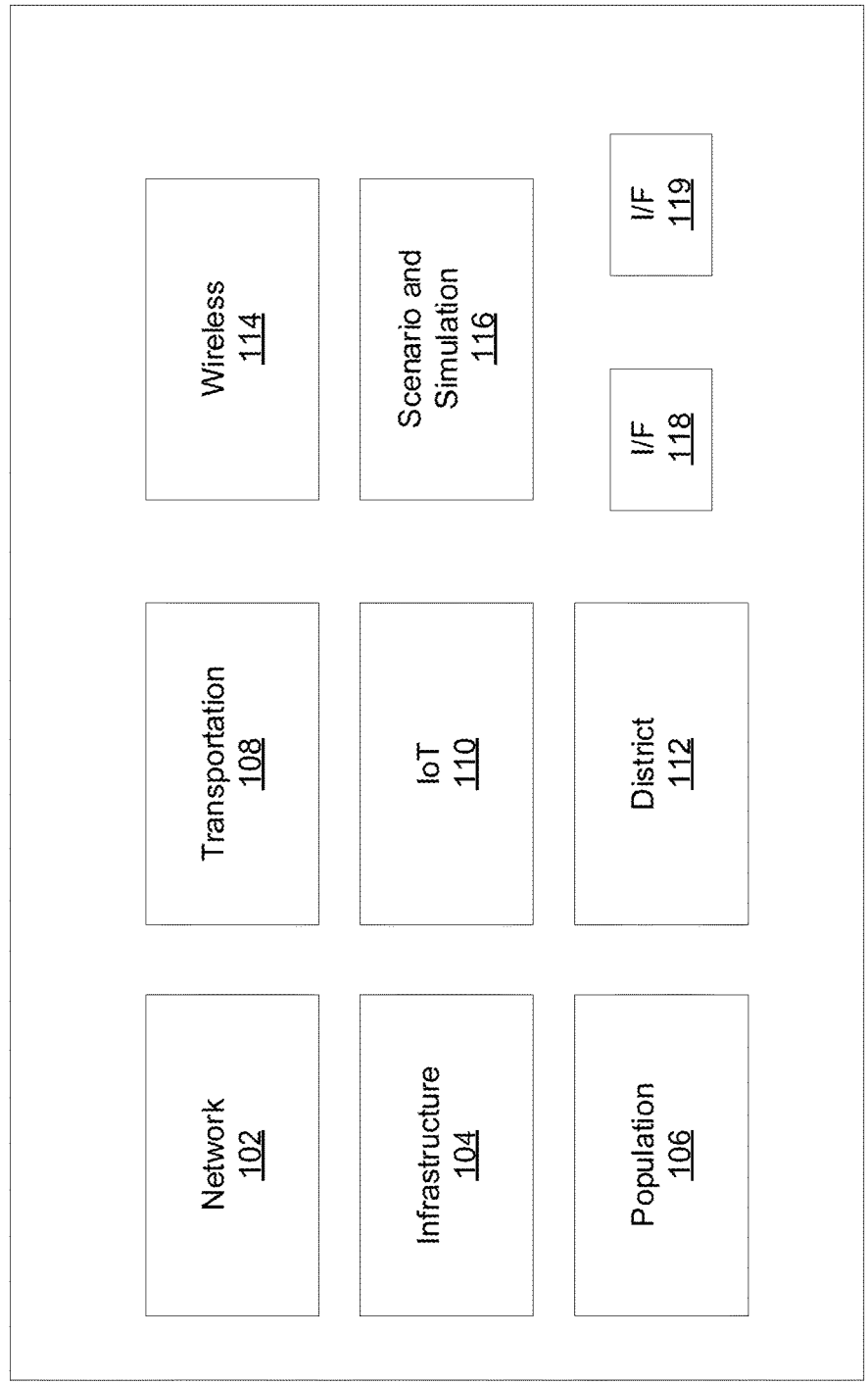
FIG. 1 is a block diagram of an exemplary system for simulating a geographical environment.

Referring to FIG. 1, one example of a system 100 for simulating a city is provided for illustrative purposes. It should be noted that the term "city" is used for illustrative purposes, but the present disclosure should not be limited to a city. System 100 may be used to simulate many different geographical locations or districts managed by one or more entities. For instance, system 100 may simulate a village, a township, a state, or a country. System 100 may simulate entities that are not managed by traditional governmental entities. For instance, system 100 may be used to simulate corporate infrastructures.

System 100 in one embodiment comprises a plurality of components 101 that operate in conjunction to model a city. Components 101 may take many different forms. Components 101 be implemented as standalone hardware comprised of various hardware components or a combination of hardware and/or software components. For example, components 101 may comprise programmable microcontrollers, memory devices, application specific integrated circuits, and/or display devices. Components 101 may be implemented as one or more virtualized functions implemented on general purpose hardware, in lieu of having dedicated hardware to perform their various functions. That is, general purpose hardware may be configured to run virtual elements to support the functionality described herein. Furthermore, it is noted that the software and hardware components 101 described herein may be combined, divided, and distributed over system 100 without departing from the scope of the present disclosure.

As an example, a component 101 may utilize a processor, a memory to model an aspect of a city. For instance, in the case of transportation, a processor may execute code in the memory that simulates the operation of a transportation system. The user interface may be used to input certain features of the transportation system. Examples would be traffic density at certain times of the day, speed limits, public transportation, and the like. The feature data may be stored in a memory device. The processor may execute a simulation of the transportation system and output it through the user interface device, which may include a display device. In a similar manner, a component 101 may utilize a programmable micro controller and a display device to model a power system. The microcontroller may output data to another display device that demonstrates the operation of the power system. The simulation of the transportation system and the power system would be happening in parallel and integrated together, along with other components 101 that are sued to model a city. Components 101 in one example may use data, to execute simulations, that is provided by one or more user interfaces and/or data interfaces. These interfaces may allow a user to input data into system 100 that represents how an actual city functions under certain conditions. In addition, components may use a data interface to pull existing and evolving real world data into system 100 for application to simulations.

The output of the components may be displayed through one or more output devices. An output device may comprise many things. In one example, an output device may be display device such as a monitor, a liquid crystal display, a projector, or through an augmented reality layer to an augmented reality headset. The output devices may output data that describes the operation of the component. The data may comprise different forms. In one example, the data may be graphical or tabular data. In another example, the data may be animated or virtual reality data that depicts what it is like to be present in a part of the city. For instance, a transportation component may display a map of a city with depictions of traffic moving through the city. A power generation component may display the various power generation systems, such as plants, wind farms, solar farms, etc. that are producing power. There may be data superimposed next to the plants that depict their operating characteristics. In one example, the display of the power generation system may be integrated with the transportation data such that one could see the traffic moving around the power plants. The display of the data depicting the operation of the city could be provided on one or more output devices. The user in one example could view an operation of one aspect of the city by selection from a menu. In another example, the operation of various aspects of the city could be displayed together in an "always on" mode.

Another example of a display device is an actual physical model of a city. The model may comprise a map with various city infrastructure and physical characteristics placed thereon. The infrastructure may comprise buildings, power systems, roads, railroads, communications networks, and the like. Outputs may include led lighting to simulate lighting districts of the city. Wind turbines could be shown turning. Automobile and pedestrian traffic could be depicted on one or more LCD screens. A traffic light system may be superimposed on the streets of the map and the conditions of the various lights would be depicted through output lighting devices, and the traffic patterns could be shown changing as the lights changed. Supplementary data describing the operation of the model could be depicted on projectors or virtual reality devices. For instance, power generation input/output data could be depicted on an output device located near a power plant, crime statistic could be shown near a neighborhood. In other words, a physical city model could be augmented using various output devices, which output data in accordance with hardware and/or software components 101 that are programmed to simulate various aspects of the city.

In one example, components 101 may simulate an aspect of city by executing a set of rules operating on a processor. In another example, components 101 may utilize machine learning and/or artificial intelligence modules operating on a processor. Components 101 may be provided with data or information that represents the functioning of a city. For example, a component 101 simulating traffic may be provided with traffic data for a city. A component 101 simulating power generation may be provided with power plant data for a city. Both components 101 may include artificial intelligence or machine learning algorithms that understand how weather may change traffic and power generation. In a representative scenario, a change in weather may be introduced into system and the components 101 would respond accordingly. The change in weather may be introduced by a user inputting the change into system 101 or as part of a scenario that is introduced into system 101. Another example would be to use public event or calendar data, which could then be used to simulate changes in traffic or power generation. As will be discussed herein, a scenario may be introduced into system 101 using a scenario generator, which creates various scenarios that could occur in a real-world city environment. Each scenario may have one or more parameters associated with the scenario that could be injected in the components 101 of system 100, which would then respond in accordance to their programming models. The holistic effect would represent a simulation of the modeled city.

Referring further to FIG. 1, exemplary components 101 will now be described for illustrative purposes. Components 101 may include, but are not limited to, network component 102, city infrastructure component 104, population component 106, transportation component 108, IOT component 110, city district component 112, wireless communication component 114, scenarios and simulation engine 116. System in one example also includes one or more user interface 118 and data interface 119. System 100 in this example may serve as a simulated city-scale environment providing simulations to infrastructure management entities. Such entities may include government, pseudo governmental, and private management entities. Such entities may manage city wide infrastructure or portions of city infrastructure, such as telecommunication, utility, and transportation infrastructure. In one example, machine learning, and artificial intelligence models may be used by the components to refine and optimize how the effect of events are represented in simulations. For example, machine learning, and artificial intelligence models may use real world data regarding how certain aspects of cities, corresponding to the city that is being simulated, respond to certain events. Components may use the models and data to provide increasingly realistic and accurate simulations.

Referring further to FIG. 1, in one example, network component 102 is employed to provide simulated functionality of connected network devices such as routers, firewalls, intrusion detection systems and data. Network components 101 in one example may include a database or topology map of such network devices. A topology map may be taken from an existing city or telecommunications provide or may be generated as a proposed topology. Network component 102 simulates the operation of the connected devices using rules, machine learning modules, and/or artificial intelligence modules, executing on a processor, and data applicable to such networks.

City infrastructure component 104 in one example manages simulated infrastructure elements. Infrastructure elements include, but are not limited to elements, such as power plants, water mains, traffic control devices, utility and security services. Infrastructure elements may include current or proposed infrastructure of a city. The infrastructure element data may include information, such as type, capacity, schematics, operating statistics (e.g., projected supply and demand), emergency response plans, etc. City infrastructure component 104 simulates the operation of city infrastructure using rules, machine learning modules, and/or artificial intelligence modules, executing on a processor, and data applicable to such infrastructure.

Population component 106 in one example may model a population of a city. In one example, population component 106 may cause the model to change in accordance with demographic trends of a current or projected city. Such demographic trends may include current population and/or projected increases or decreases of population. Demographic trends may include the projected movements of populations within a city. Population component 106 in one example may generate virtual avatars, which may be displayed on output devices, to respond to external conditions that occur within a city. For example, if a natural disaster, a service disruption, or a transportation gridlock were to occur, one or more virtual avatars could be shown responding to the condition. A reaction could be procedurally programmed into the virtual avatar(s) or the virtual avatar(s) behavior could develop in accordance with machine learning algorithms and data taken from real life situations or through artificial intelligence. In another example, reporting tools, such as charts, heat maps, etc. may be used to generate the effect of an event on population. Population component 106 may receive the data that it utilizes to model a population through user interface 118 or data interface 119 through which it is interfaced to one or more public or private networks having one or more databases containing population data. Population component 106 simulates population using rules, machine learning modules, and/or artificial intelligence modules, executing on a processor, and population data.

Transportation component 108 in one example may generate a simulated representation of vehicles, such as cars, public transportation, planes, and/or drones, which intelligently react to simulated conditions such as weather patterns, public congestion, service disruption, accidents and/or traffic monitoring systems. Transportation component 108 may generate avatars, charts, heat maps, demonstrate the effect of various conditions on traffic. Transportation component 108 may include traffic lights data, which can help infrastructure understand how to modify traffic light patterns, in under conditions, to optimize traffic flow. Transportation component 108 may receive the data that it utilizes to model traffic through user interface 118, data interface 119, or through network component 120 by which it is interfaced to one or more public or private networks having one or more databases containing traffic data. Transportation component 108 simulates transportation systems using rules, machine learning modules, and/or artificial intelligence modules, executing on a processor, and data applicable to transportation systems 108.

IoT component 110 in one example simulates a universe of Internet of Things devices, such as CCTV cameras, telemetry sensors embedded into city infrastructure, and consumer devices, such as thermostats or home security, which are used in cities. IOT endpoints can be programmed to output data that is typical of these devices and then changes in condition may be introduced to determine the effect of such changes on a city. For example, if one or more IoT endpoints were subjected to an event, such as a power failure or hack, then IoT component 110 could determine the impact of such an event on the various other components of the city. For instance, a sudden failure of CCTV cameras or home security services may cause an increase in crime in a given area, which then may influence other components, such as traffic or population. IoT component 110 simulates transportation systems using rules, machine learning modules, and/or artificial intelligence modules, executing on a processor, and usage data applicable to IoT devices.

City district component 112 in one example manages the district model of a city. City district model 112 may have one or more areas that simulate the modern city. Such area may include industrial, residential, agricultural, entertainment, and business districts. The areas may include data modeling existing districts of a city or planned district of city. The areas may be defined by several parameters, including the grid coordinates of the area, coordinates and descriptions of buildings within the area, the type of the area, the population density, the natural geography, the infrastructure, crime rates, etc. City district component 112 simulates the evolution of the areas of a city using rules, machine learning modules, and/or artificial intelligence modules, executing on a processor, and usage data applicable to city districts.

Wireless telecommunications component 114 will provide a simulated model of a wireless network infrastructure. Such a simulated infrastructure may include the location of cell towers, switching centers, central offices, and connectivity characteristics (3G-5G, etc.) of these devices. Wireless communications component 114 may use density of mobile devices operated by the population. Wireless communications component 114 response to environmental factors such as interference and signal penetration based on surroundings, such as those provided in the city district model 114. For example, an area defined as having a dense population of tall metallic building will have different signal characteristics than an area defined as being sparsely built wooden buildings. The wireless communications model 114 may change over time. The underlying data of wireless communication model 114 may be input through user interface 118 and/or network component 120. The underlying data may be drawn from the operation of existing wireless infrastructure. For example, if the construction of a building or the addition of an antenna affected signal penetration in the real world, then the effect could be modeled by the wireless communications component 114. In one example, machine learning, and artificial intelligence models could be used to receive data from functioning wireless networks in the real world and refine their predictions as to how certain events would affect wireless communications within the areas of the city.

Scenario and simulation engine ("SAS Engine") 116 in one example comprises a hardware and/or software layer that orchestrates various scenarios that can be simulated for a city. SAS Engine 116 in one example may comprise a game engine that will provide an orchestration function to enhance virtual assets with data parameters and interactions based on scenarios that are input into SAS engine. In one example, SAS Engine 116 may be a game engine that is operable to simulate the operation of a city. SAS Engine 116 may send and receive data from system components 101. SAS Engine 116 in one example, receives the data provided by disparate components 101, aggregates the data, and correlates a likely output scenario for the city based on the aggregated data. SAS Engine 116 then outputs the scenario parameters to the components 101, which then execute the scenario. Thus, SAS Engine 116 thus uses real aggregated data (e.g. business, industrial, population, environment and technical) to analyze scenarios and display correlated outcomes based on an aggregated simulation data. Using this type of simulation and data analysis using virtually reconstructed environments can assist security risk assessment personnel in evaluating scenarios and identify needs for smart city services and infrastructure.

Figure 2:
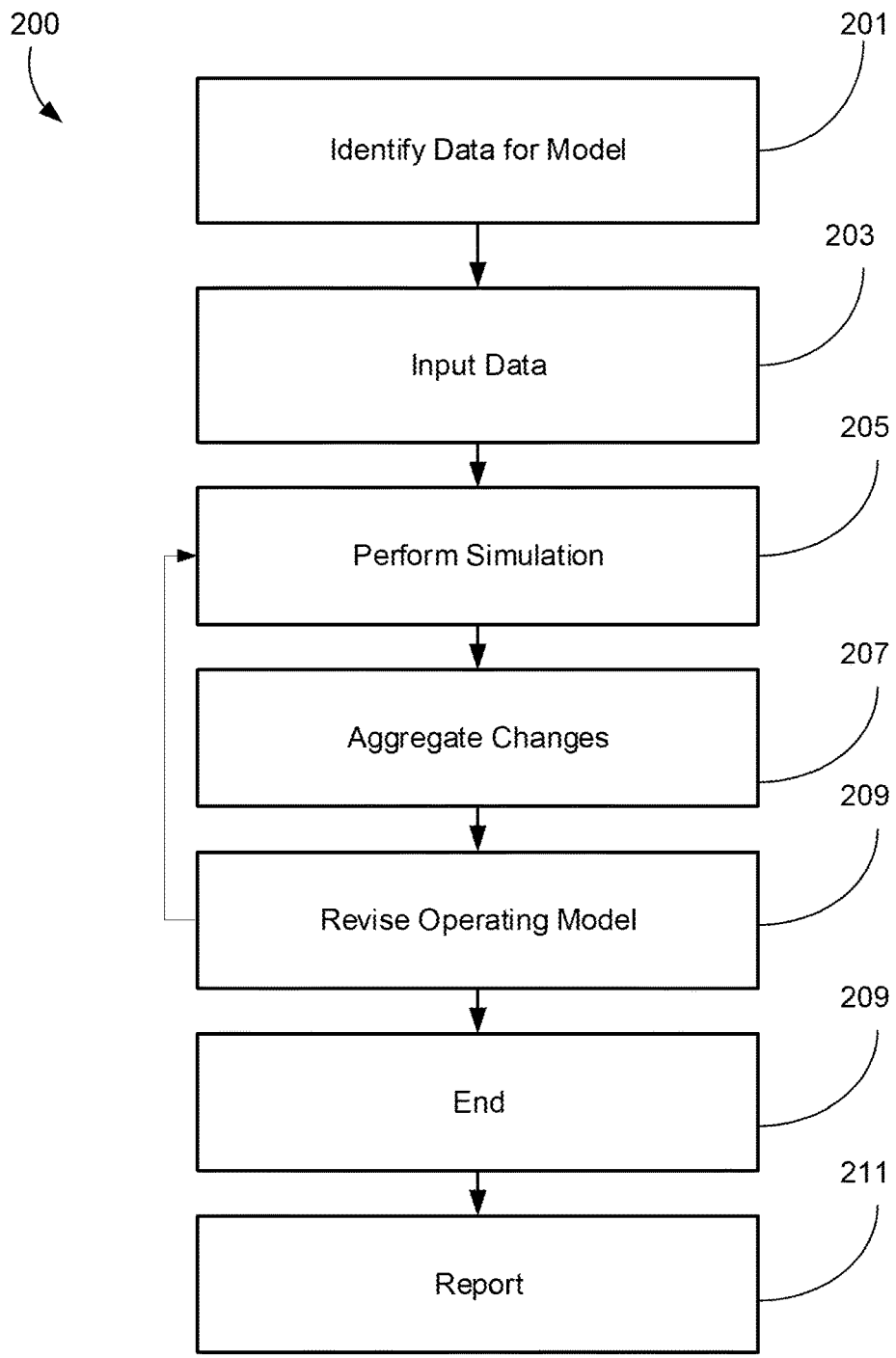
FIG. 2 is a flowchart depicting an exemplary method of operation of the system of FIG. 1.

Referring to FIG. 2, an exemplary embodiment of a method 200 for simulation of a city or geographic area is now described for illustrative purposes.

In step 201, data is identified for the area to be modeled. Modeling a city or area in one example comprises identifying data that provides a comprehensive representation of city or area. Examples of such data includes, but is not limited to, road and rail maps, building coordinates, power generation infrastructure, water purification infrastructure, telecommunications network data, population data, etc. The amount of data that is collected is dependent on the area being modeled. A dense city would in some instances have more data than a rural area or a city neighborhood. The data that is identified in one example may be identified manually, by an operator, by the relevant components 101 of system 100, or in a central repository. In one embodiment, city models may be standardized and stored in a repository. System 100 could pull various city models from the repository based on the simulation that an operator wanted to conduct.

In another embodiment, SAS Engine 116 could identify the data that it requires to run a scenario. For instance, SAS Engine 116 could be told to simulate a city of 1,000,000 people in an industrial area of a country. SAS Engine 116 may formulate a data model necessary to simulate such a city and identify the data needed to simulate such a city.

In step 203, data is input into the system 100. In one example, data is input into system 100 in a decentralized way by inputting data into the component(s) 101 to which it is relevant during a simulation. In another embodiment, data may be input into a central memory or repository, which components 101 would draw from during a simulation. In another embodiment, data may be input into a memory component of SAS Engine 116, which may use the data in simulating scenarios.

In step 205, system 100 performs a simulation. The simulation in one example involves SAS Engine 116 running a scenario and then instructing components 101 how to behave. For example, SAS Engine 116 may create a model for an industrial city of 1,000,000. SAS Engine 116 may instruct the various components 101 how to behave during "normal" or "steady state" operating conditions. SAS Engine 116 may decide that it wants to model the behavior of system 100 based on an event. Such an event may be a weather event, a manmade event, or some other event that could be forecasted for the city. SAS Engine 116 may determine that a scenario is likely to occur based on the event. For instance, a weather event may shut down power infrastructure. SAS Engine 116 may instruct infrastructure component 104 to decrease power input by a percentage by causing blackouts parts of a city. Transportation component 108 would sense such a change and identify how the loss of traffic lights would affect traffic flow. Other components 101 would detect changes and respond accordingly. For instance, the blackouts may cause a surge in the use of the wireless network infrastructure that would be simulated by wireless communications component 114.

In step 207, the data reflecting the changes introduced into system 100 by the preceding changes is aggregated. The aggregation of data may be the collecting of all operating data of system 100 after the introduction of the change, or it may be focused only on those elements that SAS Engine 116 believes are relevant to the change.

In step 209, SAS Engine 116 revises the operating model of the city based on the aggregated data. For instance, SAS Engine 116 may determine that loss of power may result in certain districts of the city operating in a different manner than prior to the introduction of the scenario. SAS Engine 116 may instruct population component 104, transportation component 108, and city district component 112 to change their operating conditions accordingly.

The method would flow back to step 205 in which SAS Engine 116 may identify additional scenarios relevant to the operation of city. For instance, SAS Engine 116 may determine that it will take a certain amount of time to fix city infrastructure or that certain new equipment will need to be introduced into the system 100. SAS Engine 116 would then instruct relevant components 100 to introduce these changes. If SAS Engine 116 or an operator were to determine to end the simulation, then in step 211, the simulation would end. In one embodiment, in step 213, SAS Engine 116 may issue a report regarding the simulation. The report may include recommended countermeasures or steps that could be taken to prevent adverse effects identified in the simulation.

It should be noted that throughout the simulation, users may have access to simulation data through access to the output devices previously described herein.

Figure 3:
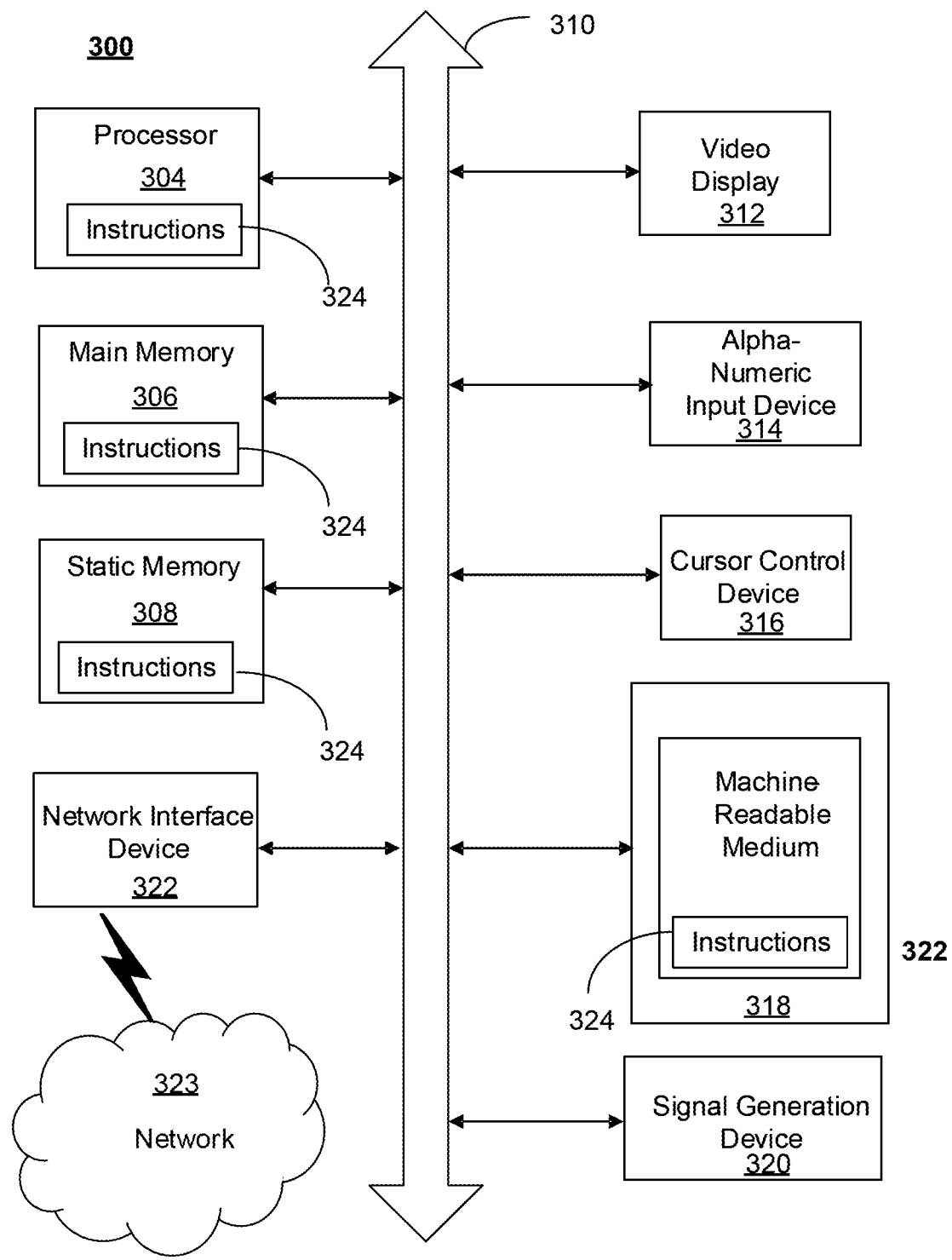
FIG. 3 is block diagram of an exemplary computing system that can be used to implement the system of FIG. 1.

FIG. 3 depicts an exemplary diagrammatic representation of a machine in the form of a computer system 300 within which a set of instructions, when executed, may cause the machine to perform any one or more of the methods described above. One or more instances of the machine can operate, for example, to perform the functions of one or more components 101 shown in FIG. 1. In some embodiments, the machine may be connected (e.g., using a network) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

Computer system 300 may include a processor (or controller) 304 (e.g., a central processing unit (CPU)), a graphics processing unit (GPU, or both), a main memory 306 and a static memory 308, which communicate with each other via a bus 310. The computer system 300 may further include a display unit 312 (e.g., liquid crystal display (LCD), a flat panel, or a solid-state display). Computer system 300 may include an input device 314 (e.g., a keyboard), a cursor control device 316 (e.g., a mouse), a disk drive unit 318, a signal generation device 320 (e.g., a speaker or remote control) and a network interface device 322 to communicate to a network 323. In distributed environments, the embodiments described in the subject disclosure can be adapted to utilize multiple display units 312 controlled by two or more computer systems 300. In this configuration, presentations described by the subject disclosure may in part be shown in a first of display units 312, while the remaining portion is presented in a second of display units 312.

The disk drive unit 318 may include a tangible computer-readable storage medium 324 on which is stored one or more sets of instructions (e.g., software 436) embodying any one or more of the methods or functions described herein, including those methods illustrated above. Instructions 336 may also reside, completely or at least partially, within main memory 306, static memory 308, or within processor 304 during execution thereof by the computer system 300. Main memory 306 and processor 304 also may constitute tangible computer-readable storage media.

While examples of a system 100 have been described in connection with various computing devices/processors, the underlying concepts may be applied to any computing device, processor, or system capable of facilitating a system 100. The various techniques described herein may be implemented in connection with hardware or software or, where appropriate, with a combination of both. Thus, the methods and devices may take the form of program code (i.e., instructions) embodied in concrete, tangible, storage media having a concrete, tangible, physical structure. Examples of tangible storage media include floppy diskettes, CD-ROMs, DVDs, hard drives, or any other tangible machine-readable storage medium (computer-readable storage medium). Thus, a computer-readable storage medium is not a signal. A computer-readable storage medium is not a transient signal. Further, a computer-readable storage medium is not a propagating signal. A computer-readable storage medium as described herein is an article of manufacture. When the program code is loaded into and executed by a machine, such as a computer, the machine becomes a device for communications. In the case of program code execution on programmable computers, the computing device will generally include a processor, a storage medium readable by the processor (including volatile or nonvolatile memory or storage elements), at least one input device, and at least one output device. The program(s) can be implemented in assembly or machine language, if desired. The language can be a compiled or interpreted language and may be combined with hardware implementations.

The methods and devices associated with a system 100 as described herein also may be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, or the like, the machine becomes an device for implementing telecommunications as described herein. When implemented on a general-purpose processor, the program code combines with the processor to provide a unique device that operates to invoke the functionality of a telecommunications system.

While a system 100 has been described in connection with the various examples of the various figures, it is to be understood that other similar implementations may be used or modifications and additions may be made to the described examples without deviating therefrom. For example, one skilled in the art will recognize that a system 100 as described in the instant application may apply to any environment, whether wired or wireless, and may be applied to any number of such devices connected via a communications network and interacting across the network. Therefore, system 100 as described herein should not be limited to any single example, but rather should be construed in breadth and scope in accordance with the appended claims.

The invention claimed is:

1. A method, comprising:

identifying and collecting, by a processing system including a processor, data required to simulate a geographical area;

inputting, by the processing system, the data into a simulation model for the geographical area, wherein the simulation model includes a plurality of model components, wherein the plurality of model components include a population model component to model changes in population associated with the geographical area, and wherein the data includes the population associated with the geographical area;

determining, by the processing system, a likely scenario associated with a first model component of the plurality of model components according to an occurrence of a first event;

applying, by the processing system, the likely scenario to the first model component of the plurality of model components of the simulation model;

performing, by the processing system, a simulation of the simulation model via a simulation engine for the geographical area according to the applying the likely scenario;

monitoring, by the processing system, performance of the population model component of the plurality of model components of the simulation model during the performing the simulation of the simulation model;

generating, by the processing system, a revised scenario based on changes to the performance of the population model component of the plurality of model components of the simulation model, wherein the changes to the performance of the population model component include demographic trends associated with the geographical area;

applying, by the processing system, the revised scenario to the simulation model;

collecting, by the processing system, model data generated by the simulation model during the performing the simulation of the simulation model to generate aggregated data; and revising, by the processing system, the simulation model according to the aggregated data to create a revised simulation model.

2. The method of claim 1, wherein the geographical area comprises a smart city.

3. The method of claim 1, wherein the first event comprises a cyber-attack perpetrated against the geographical area.

4. The method of claim 1, wherein the first event comprises a catastrophical event.

5. The method of claim 1, wherein the simulation engine comprises a game engine.

6. The method of claim 1, wherein the performing the simulation of the simulation model includes real-life data that is taken from the geographical area that is being simulated.

7. The method of claim 1, wherein the performing the simulation of the simulation model includes performance data of a telecommunications network infrastructure of the geographical area.

8. The method of claim 1, wherein the performing the simulation of the simulation model includes performance data taken from a power generation infrastructure of the geographical area.

9. The method of claim 1, wherein the changes to the performance of the population model component include population movements associated with the geographical area.

10. The method of claim 1, wherein the performing the simulation of the simulation model includes traffic data taken from the geographical area.

11. A system, including a device including a processing system including a processor and instructions stored on a non-transitory computer readable medium, the instructions when executed perform a method including:

identifying and collecting data required to simulate a geographical area;

inputting the data into a simulation model for the geographical area, wherein the simulation model includes a plurality of model components, wherein the plurality of model components include a population model component to model changes in population associated with the geographical area, and wherein the data includes the population associated with the geographical area;

determining a likely scenario associated with a first model component of the plurality of model components according to an occurrence of a first event;

applying the likely scenario to the first model component of the plurality of model components of the simulation model;

performing a simulation of the simulation model via a simulation engine for the geographical area according to the applying the likely scenario;

monitoring performance of the population model component of the plurality of model components of the simulation model during the performing the simulation of the simulation model;

generating a revised scenario based on changes to the performance of the population model component of the plurality of model components of the simulation model, wherein the changes to the performance of the population model component include demographic trends associated with the geographical area;

applying the revised scenario to the simulation model;

collecting model data generated by the simulation model during the performing the simulation of the simulation model to generate aggregated data; and revising the simulation model according to the aggregated data to generate a revised simulation model.

12. The system of claim 11, wherein the geographical area comprises a smart city.

13. The system of claim 11, wherein the first event comprises a cyber-attack perpetrated against the geographical area.

14. The system of claim 11, wherein the first event comprises a catastrophical event.

15. The system of claim 11, wherein the simulation engine comprises a game engine.

16. The system of claim 11, wherein the performing the simulation of the simulation model includes real-life data that is taken from the geographical area that is being simulated.

17. The system of claim 11, wherein the performing the simulation of the simulation model includes performance data of a telecommunications network infrastructure of the geographical area.

18. The system of claim 11, wherein the performing the simulation of the simulation model includes data taken from a power generation infrastructure of the geographical area.

19. The system of claim 11, wherein the changes to the performance of the population model component include population movements associated with the geographical area.

20. A non-transitory machine-readable medium, comprising executable instructions that, when executed by a residential gateway device comprising a processing system including a processor, facilitate performance of operations, the operations comprising:

identifying and collecting data required to simulate a geographical area;

inputting the data into a simulation model for the geographical area, wherein the simulation model includes a plurality of model components, wherein the plurality of model components include a population model component to model changes in population associated with the geographical area, and wherein the data includes the population associated with the geographical area;

determining a likely scenario associated with a first model component of the plurality of model components according to an occurrence of a first event;

applying the likely scenario to the first model component of the plurality of model components of the simulation model;

performing a simulation of the simulation model via a simulation engine for the geographical area according to the applying the likely scenario;

monitoring performance of the population model component of the plurality of model components of the simulation model during the performing the simulation of the simulation model;

generating a revised scenario based on changes to the performance of the population model component of the plurality of model components of the simulation model, wherein the changes to the performance of the population model component include demographic trends associated with the geographical area; and applying the revised scenario to the simulation model;

collecting model data generated by the simulation model during the performing the simulation of the simulation model to generate aggregated data; and revising the simulation model according to the aggregated data to generate a revised simulation model.

* * * * *